PHOTOVOLTAIC CELLS OF SINTERED MATERIAL

Filed Nov. 1, 1957

INVENTOR.
FREDERICK H. NICOLL
BY J. L. Whittaker
ATTORNEY

United States Patent Office 2,999,240
Patented Sept. 5, 1961

2,999,240

PHOTOVOLTAIC CELLS OF SINTERED MATERIAL

Frederick H. Nicoll, Princeton, N.J., assignor, by mesne assignments, to the United States of America as represented by the Secretary of the Army Filed Nov. 1, 1957, Ser. No. 694,029
1 Claim. (Cl. 136—89)

This invention relates generally to photovoltaic devices and particularly to improved devices for converting radiant energy to electrical energy, and to methods for preparing these devices.

A radiation converter of the photovoltaic type generates a voltage upon exposure to light. Photovoltaic cells may be used, for example, as solar batteries.

A typical photovoltaic cell comprises two electrodes in contact with a body of semiconducting material. In one type of cell, one of these electrodes is non-rectifying and the other is rectifying. The non-rectifying electrode, also referred to as the ohmic electrode, makes a low resistance contact with the semiconducting body. The other electrode forms a junction or barrier at the interface between the electrode and the body. The junction exhibits a high resistance to current flow in one direction and a low resistance to current flow in the other direction. The photovoltaic effect takes place at the junction when light causes a separation of current carriers to opposite sides of the junction.

Presently known photovoltaic cells are expensive because they use semiconducting bodies which are formed from relatively costly processed materials, such as purified germanium or silicon crystals. In addition the methods of forming photovoltaic cells, as presently known, are time-consuming and expensive, since it is generally difficult to provide an efficient rectifying electrode for the semiconducting body.

The method of making a relatively inexpensive body comprising a sintered layer of cadmium sulphide or cadmium selenide, which may be used in the preparation of photoconductive devices, has been disclosed by Thomsen in Patent 2,765,385. Also, Thomsen describes a simple method of applying ohmic electrodes to the body. This is accomplished by spraying, silk-screening, or painting a silver paste preparation onto the surface of the body to form an electrode. Silver paste electrodes on such sintered bodies have been known to be ohmic in character. Similarly a transparent conducting coating such as a tin oxide film on a glass substrate has ohmic properties.

In its simplest form, a photoconductive device comprises a body of photoconductive material and a pair of ohmic electrodes attached thereto. In order for electrical current to flow through the device, an external voltage must be applied to the electrodes.

An object of the invention is to provide new and improved photovoltaic cells including sintered polycrystalline semiconducting layers.

Another object of the invention is to provide improved, simplified, and economical methods of making photovoltaic cells.

According to the instant invention, applicant has discovered that photovoltaic cells may be formed from a sintered polycrystalline body, a non-rectifying or ohmic electrode in electrical contact with the body, and a rectifying electrode in electrical contact with the body. In preferred embodiments of the invention, the sintered body comprises a substantially continuous polycrystalline layer of interlocked crystals. The crystals may comprise a predominant proportion of a substance selected from the group consisting of selenides, sulphides, and sulphoselenides of cadmium having incorporated therein activator proportions of a halide. The halide ion is employed to make the polycrystalline body conducting. The ohmic electrode may comprise metallic silver particles suspended in a chemically resistant organic binder, such as may be prepared from most air drying silver pastes. The ohmic electrode may also comprise glass which has been treated to render its surface electrically conducting. The rectifying electrode comprises, for example, metallic copper particles suspended in a chemically resistant organic binder, such as may be prepared from most commercial air drying copper pastes. By the use of a copper paste rectifying electrode, and an ohmic electrode formed from either silver paste or from a transparent conducting coating of tin oxide, the difficulty and expense of providing such electrodes is materially reduced with little or no sacrifice in efficiency.

A preferred method of the invention comprises producing a sintered layer of interlocked crystals and then applying discrete areas of silver paste and copper paste to the layers as by painting, spraying, or silk-screening and then drying in air.

By another method, the polycrystalline layer is sintered upon a glass plate whose surface has previously been treated to render it electrically conducting. The treated glass surface serves as the ohmic electrode. The rectifying electrode is then formed by spraying, painting, or screening copper paste upon the sintered layer.

The invention is more fully described in the following detailed description when read with the drawing in which.

*Example 1*

Figures 1, 2, 3, 4:
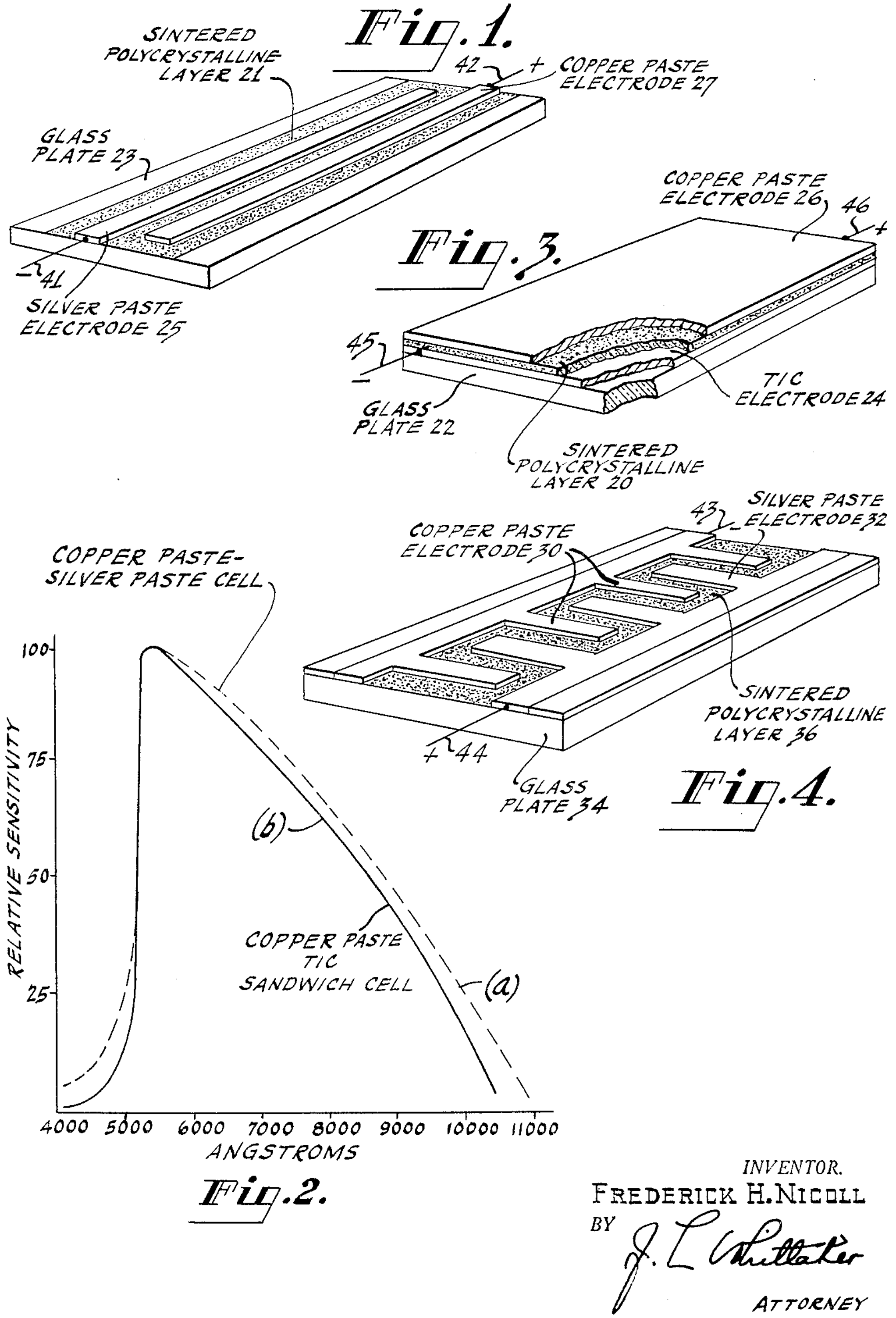
FIGURE 1 is a perspective view of one embodiment of a photovoltaic cell according to the invention.
FIGURE 2 is a pair of spectral response curves for typical photovoltaic cells prepared according to the invention.
FIGURE 3 is a cutaway perspective view of a second embodiment of a photovoltaic cell according to the invention.
FIGURE 4 is a perspective view of a third embodiment of a photovoltaic cell according to the invention.

Referring to FIGURE 1, a preferred photovoltaic cell of the invention includes a layer 21 comprising a sintered continuous polycrystalline layer of interlocked cadmium sulphide crystals having a silver paste ohmic electrode 25 and a copper paste rectifying electrode 27 attached thereto.

The sintered continuous polycrystalline layer 21 is formed on an untreated glass plate 23. An intimate mixture of 100 grams of cadmium sulphide, 10 grams of cadmium chloride, 1.7 milliliters of 0.1M cupric chloride and 500 milliliters of water is prepared. This mixture may be prepared in a blender such as is used for mixing powder with water. The yellow, viscous liquid mixture is applied, as by spraying or brushing, to a borosilicate glass plate to a desired thickness and then dried. The glass plate bearing a powder coating is fired at 600° C. for about 5 minutes in a restricted volume of air and then cooled. During the firing step the cadmium chloride melts, dissolving the copper salt and some of the cadmium sulphide. On further heating, substantially all of the cadium sulphide recrystallizes, and the cadmium chloride evaporates. When substantially all of the cadmium chloride has evaporated, the cadmium sulphide crystals are interlocked with one another forming a substantially continuous polycrystalline layer of interlocked crystals on the glass plate. The layer 21 is firmly adherent to the glass 23.

A pair of metallic paste electrodes, one of copper paste 27, and the other of silver paste 25, is then sprayed or silk-screened onto the crystal layer 21, and air dried at room temperature.

Electrically conducting insulated wire leads 41 and 42 are attached to the electrodes 25 and 27 respectively to provide connection means for the electrical output. Each lead may be joined to the electrode by pressing a stripped end of the wire to the surface of the electrode and then simply applying a quantity of correlative paste over and surrounding the end of the wire. The metallic paste is then air dried and thus cements the wire end to the paste electrode making a fixed conducting contact.

In place of cadmium sulphide, cadmium selenide or a mixture of cadmium sulphide and cadmium selenide may be used.

The liquid mixture is coated on a borosilicate glass plate 23 in Example 1. Other substrates which are non-conductors, which are non-reactive with the ingredients of the mixture, and which will stand the firing temperature of the Example 1 may be used, for example, mica, quartz, glass and ceramic materials.

Cadmium chloride is introduced to act as a solvent for the crystals formed from cadmium sulphide or its equivalents. In addition to cadmium chloride, cadmium bromide, and cadmium iodide, for example, may be used as a solvent for these crystals. In general, any material which is a solvent for the crystals and which may be removed by evaporation at the firing temperature may be used. While cadmium chloride is introduced into the coating mixture in the example, it may also be introduced by volatilization in the firing chamber during firing, such that it deposits upon the power layer for a sufficient period of time to dissolve part or all of the crystal and recrystallize it.

As presently known, a copper or silver activator is required to be incorporated into the crystals when producing sintered photoconducting layers for photoconductive devices. According to the instant invention, copper or silver ion need not be incorporated into the crystal structure for forming photovoltaic devices. The devices described herein generate a voltage when light or radiant energy falls on the area of contact between the sintered crystal layer and the copper paste rectifying electrode.

The copper paste may be, by way of example, the commercial type known as "dag" colloidal Dispersion No. 235. It is a dispersion of finely divided metallic copper particles in a chemically resistant heavy body lacquer solution. The properties of the Dispersion No. 235 are as follows:

| | |
|---|---|
| Pigment | Metallic copper. |
| Resin | Lacquer type. |
| Total solids | 66% by weight. |
| Density | 14.5/lbs./gal. |
| Covering power | Approx. 45 sq. ft./lb. |
| Shelf life | 6 months. |

"Dag" Dispersion No. 235 should be thoroughly mixed prior to use. It settles on standing but may be re-suspended with agitation. For spray application it may be diluted in the ratio of two parts of product to one part of thinner. It should not be diluted more than one to one.

Brush application requires only a slight dilution of the concentrated material. A stiff brush is used since a soft brush will permit the copper to settle to the under side of the film leaving an excess of lacquer on its surface. No baking is required since the film will air dry and can be handled within a few minutes. The paste may be formed in the laboratory by mixing processed copper flakes into a suspension of heavy body copper lacquer which is chemically resistant, such as methyl methacrylate resin. Before mixing, the copper flakes are bathed in an ether solution to dissolve any insulating stearate material thereon, which is often used to coat the copper particles to prevent oxidation. In this form, the copper paste electrode 27 is conductive and acts as a rectifying contact.

The silver paste may be the commonly used commercial paste, Dupont Type A (air set) for example, as shown in the Dupont Ceramic Products Bulletin CP 2-554. The silver paste may be formed by mixing processed silver particles in a plastic binder such as methyl methacrylate resin, which is soluble in thinner. A thinner such as butyl Cellosolve acetate is used as a solvent, and upon application of the silver paste to a surface, the thinner evaporates leaving a conducting layer of silver particles embedded in the plastic. The curing time for the silver paste is 10-12 hours at room temperature, or only 10 minutes at 100-160° F. The silver paste electrode 25 may be applied by spraying, silk-screening, or squeegeeing. The silver paste electrode 25 thus formed makes an ohmic contact to the sintered layer 21 without forming a barrier or junction.

Photovoltaic cells of the type illustrated in FIGURE 1, using cadmium sulphide crystals, a copper paste rectifying electrode and a silver paste ohmic electrode have produced open-circuit voltages of approximately 0.45 volts. Also, a current of 7 milliamperes is obtainable when a similar type cell of 380 square millimeters in area is exposed to a 100 watt incandescent lamp at about 0.25 inch from the lamp.

Referring to FIGURE 2*a*, a spectral response curve is shown for a photovoltaic cell of the type described in Example 1. The photovoltaic cell was examined under applied radiation within the range of wave lengths from 4,000 to 11,000 angstroms. It was observed that the peak responses occurred at about 5,300 angstroms, and a sharp cutoff took place at about 5,000 angstroms.

*Example 2*

Referring to FIGURE 3 which is a cutaway view of a sandwich type cell, a photovoltaic cell may be formed by applying a copper paste electrode 26 to a sintered polycrystalline layer 20 formed over a transparent conducting layer 24 (hereinafter referred to as the TIC electrode) on a glass substrate 22.

The TIC electrode 24 may be prepared by exposing heated glass to the vapors of tin chloride or titanium chloride and afterwards treating the coating thus formed in a slightly reducing atmosphere. In some cases the hot glass plate 22 may be treated with a mixture of stannic chloride in absolute alcohol and glacial acetic acid.

The sintered polycrystalline layer 20 is formed in the same manner as described in Example 1 over the TIC electrode 24, and then the metallic paste, such as commercial copper paste, is sprayed or silk-screened over the layer 20. The TIC electrode 24 serves as the ohmic contact, and the copper paste electrode 26 provides the rectifying action.

Electrically conducting insulated wire leads 45 and 46 are joined to the electrodes 24 and 26 in the same manner as described for Example 1. But in this example, a silver paste is used to cement the wire lead to the TIC electrode 24 to make a conducting contact.

The spectral response curve for a sandwich type photovoltaic cell of Example 2 shown in FIG. 2*b*, simulates the curve for the photovoltaic cell described in Example 1 in that the peak and cutoff points occur approximately at the same wavelength.

*Example 3*

Referring to FIG. 4, another form of photovoltaic cell according to the invention is shown in which a sintered layer 36 is deposited upon a glass plate 34 in the manner described in Example 1. As illustrated in FIG. 4, the copper paste electrodes 30 and silver paste electrodes 32 are formed over the layer 36 in a configuration having a series of interdigitated fingers extending so that the electrodes are equidistant from one another at every point. The pattern may easily be produced by silk-screening.

Electrically conducting insulating wire leads 43 and 44 are attached to electrodes 30 and 32 in the same fashion as described for Example 1.

*Example 4*

Another form of photovoltaic cell may be formed in the manner described by Example 1, excepting that cadmium selenide is used in the mixture instead of cadmium sulphide.

*Example 5*

Still another photovoltaic cell may be formed in the manner described by Example 1 excepting that cadmium sulpho-selenide is used instead of cadmium sulphide.

The devices described herein are comparable to presently known selenium barrier-layer photovoltaic cells in conversion efficiency and performance. The metallic pastes used in making the electrodes of the present invention are standard commercial stock items and low in cost. The methods of application are relatively simple, adaptable for mass production, and economical. Also, by spraying or silk-screening, almost any pattern or desired configuration can be produced. Since the pastes are air-drying no heating or baking or other costly, time-consuming steps are required. The low cost and simple handling are decided advantages.

What is claimed is:

A photovoltaic device comprising a nonconducting borosilicate glass base plate, an electrically conducting transparent electrode continuously coextensive and connected to said plate forming an ohmic contact with said plate, said transparent electrode including a chemically reduced layer of tin or titanium chloride, a substantially continuous central polycrystalline layer of interlocked photovoltaic crystals formed from the group consisting of sulfides, selenides and sulphoselenides of cadmium, said layer being substantially coextensive with said conductive electrode, the crystals of said polycrystalline layer having incorporated therein activator proportions of a halide ion, and a copper paste rectifying electrode including metallic copper and a resin in contact and substantially coextensive with said polycrystalline layer, and lead connections to said electrically conducting electrode and to said rectifying electrode.

References Cited in the file of this patent

UNITED STATES PATENTS

| | | |
|---|---|---|
| 2,622,117 | Benzer | Dec. 16, 1952 |
| 2,688,564 | Forgue | Sept. 7, 1954 |
| 2,736,848 | Rose | Feb. 28, 1956 |
| 2,765,385 | Thomsen | Oct. 2, 1956 |
| 2,820,841 | Carlson et al. | Jan. 21, 1958 |
| 2,844,640 | Reynolds | July 22, 1958 |
| 2,884,508 | Czipott et al. | Apr. 28, 1959 |